United States Patent
Ide

(10) Patent No.: US 9,246,034 B2
(45) Date of Patent: Jan. 26, 2016

(54) SOLAR CELL AND METHOD OF MANUFACTURING THE SAME

(75) Inventor: Daisuke Ide, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 782 days.

(21) Appl. No.: 12/562,907

(22) Filed: Sep. 18, 2009

(65) Prior Publication Data

US 2010/0078069 A1    Apr. 1, 2010

(30) Foreign Application Priority Data

Sep. 29, 2008 (JP) ................... 2008-250737

(51) Int. Cl.
*H01L 31/0352* (2006.01)
*H01L 31/0224* (2006.01)

(52) U.S. Cl.
CPC .. *H01L 31/03529* (2013.01); *H01L 31/022425* (2013.01); *Y02E 10/50* (2013.01)

(58) Field of Classification Search
CPC ................. H01L 31/022425; H01L 31/03529; Y02E 10/50
USPC ......................................... 136/252, 255, 256
See application file for complete search history.

(56) References Cited

U.S. PATENT DOCUMENTS

| | | | | |
|---|---|---|---|---|
| 4,065,781 A | * | 12/1977 | Gutknecht | H01L 21/84 257/66 |
| 5,331,183 A | * | 7/1994 | Sariciftci et al. | 257/40 |
| 5,428,249 A | * | 6/1995 | Sawayama et al. | 136/256 |
| 2004/0043528 A1 | * | 3/2004 | Kruhler | 438/57 |
| 2005/0018975 A1 | * | 1/2005 | Ho et al. | 385/88 |
| 2005/0023974 A1 | * | 2/2005 | Chwang et al. | 313/512 |
| 2006/0162770 A1 | * | 7/2006 | Matsui et al. | 136/263 |
| 2007/0144577 A1 | * | 6/2007 | Rubin et al. | 136/256 |
| 2007/0151599 A1 | * | 7/2007 | Cousins | 136/263 |
| 2010/0032014 A1 | * | 2/2010 | Bettinelli et al. | 136/258 |

FOREIGN PATENT DOCUMENTS

| | | | |
|---|---|---|---|
| JP | S63-287077 A | 11/1988 | |
| JP | 2005-101427 A | 4/2005 | |
| JP | 2006-303322 A | 11/2006 | |
| WO | WO/2008/125446 | * 10/2008 | .......... H01L 31/0224 |

* cited by examiner

*Primary Examiner* — Alexander Kollias
(74) *Attorney, Agent, or Firm* — Marvin A. Motsenbocker; Mots Law, PLLC

(57) ABSTRACT

A method of manufacturing a solar cell, including: forming a first conductivity type semiconductor layer extending along a predetermined direction on a back surface of a semiconductor substrate that has a light-receiving surface and the back surface opposite to the light-receiving surface, the first-conductivity-type semiconductor layer being divided into plural island-shaped sections arranged side by side in the predetermined direction; forming a semiconductor layer of a second conductivity type in the predetermined direction on the back surface; and forming conductive layers respectively on the first-conductivity-type semiconductor layer and the second-conductivity-type semiconductor layer by using a conductive paste, the conductive layer to be formed on the first-conductivity-type semiconductor layer being formed by a printing method such that the conductive layer to be formed on the first-conductivity-type semiconductor layer extends on a line of the plural island-shaped sections to bridge adjacent two of the plural island-shaped sections.

3 Claims, 8 Drawing Sheets

SECOND DIRECTION

FIRST DIRECTION

SOLAR CELL AND METHOD OF MANUFACTURING THE SAME

CROSS REFERENCE TO RELATED APPLICATIONS

This application claims priority based on 35 USC 119 from prior Japanese Patent Application No. P2008-250737 filed on Sep. 29, 2008, entitled "SOLAR CELL AND METHOD OF MANUFACTURING THE SAME", the entire contents of which are incorporated herein by reference

BACKGROUND OF THE INVENTION

1. Field of the Invention

The invention relates to aback junction solar cell and a method of manufacturing the solar cell.

2. Description of Related Art

Solar cells are now expected to be a new energy source because of their capability to convert sunlight, which is clean and in unlimited supply, directly into electricity. The output of a single solar cell is only several watts. Accordingly, if solar cells are used as an electric-power source (energy source) for a house, building or the like, a solar cell module is used in which multiple solar cells are electrically connected together to increase the output.

There has been known a so-called back junction solar cell in which, for the purpose of expanding the light-receiving area, multiple lines of n type regions and multiple lines of p type regions are formed alternately on a back surface of a semiconductor substrate. A collecting electrode including a transparent conductive layer and a conductive layer is formed on each n type semiconductor region. This collecting electrode collects carriers (electrons) from the n type semiconductor region. Likewise, a collecting electrode including a transparent conductive layer and a conductive layer is formed on each p type region. This collecting electrode collects carriers (positive holes or acceptors) from the p type semiconductor region.

In general, each of the n type semiconductor region, the p type semiconductor region and the transparent conductive layer can be formed in a predetermined pattern by means of a metal mask (see, for example, Japanese Patent Application Publication No. 2005-101427). The use of metal masks has an advantage because high positional accuracy of the predetermined pattern can be achieved. Note that the conductive layer can be formed by a printing method or a sputtering method.

To improve the efficiency of collecting carriers, it is preferable to narrow the distance between each n type semiconductor region and the adjacent p type semiconductor region. To this end, slits are formed in the metal mask more densely. However, the metal mask with such a structure has a lower strength, and thus tends to have some portions broken or bent (raised). This may cause a problem of damaging the surface of the semiconductor substrate or misaligning the pattern. For this reason, there is a limitation to a microscopic formation of n type semiconductor regions and p type semiconductor regions by means of metal masks.

The invention has been made in view of the above-described circumstances and aims to provide a solar cell in which n type semiconductor regions and p type semiconductor regions are densely, microscopically formed, and to provide a method of manufacturing the solar cell.

SUMMARY OF THE INVENTION

A first aspect of the invention is a method of manufacturing a solar cell, including: a step A of forming a semiconductor layer of a first conductivity type extending along a predetermined direction on a back surface of a semiconductor substrate that includes a light-receiving surface and the back surface located on the opposite side to the light-receiving surface, the first-conductivity-type semiconductor layer being divided into plural island-shaped sections arranged side by side in the predetermined direction; a step B of forming a semiconductor layer of a second conductivity type in the predetermined direction on the back surface; and a step C of forming conductive layers respectively on the first-conductivity-type semiconductor layer and the second-conductivity-type semiconductor layer by using a conductive paste, the conductive layer to be formed on the first-conductivity-type semiconductor layer being formed by a printing method such that the conductive layer to be formed on the first-conductivity-type semiconductor layer extends along a line of the plural island-shaped sections to bridge adjacent two of the plural island-shaped sections.

According to the first aspect of the invention, the first-conductivity-type semiconductor layer is formed as plural island-shaped sections arranged side by side in the predetermined direction. Even though a metal mask is used for forming the first-conductivity-type semiconductor layer, the first-conductivity-type semiconductor layer can have a thinner line width by using a metal mask. Further, according to the first aspect, since the conductive layer is formed by a printing method, the thinner lined conductive layer can be formed to bridge adjacent two of the plural island-shaped sections. A solar cell having high carrier-collection efficiency can thereby be manufactured.

In step A, the first-conductivity-type semiconductor layer may be formed using a metal mask including: plural slits corresponding to the plural island-shaped sections; and a bridge portion between adjacent two of the slits.

The semiconductor substrate may be made of a semiconductor substrate of the first conductivity type, and in step B, the second-conductivity-type semiconductor layer may be formed so as to have a width that is larger than the width of the first-conductivity-type semiconductor layer.

A second aspect of the invention is a solar cell comprising: a semiconductor substrate including a light-receiving surface and a back surface located on the opposite side to the light-receiving surface; a semiconductor layer of a first conductivity type formed along a predetermined direction on the back surface, the first-conductivity-type semiconductor layer being formed as a plurality of island-shaped sections arranged in the predetermined direction; a semiconductor layer of a second conductivity type formed in the predetermined direction on the back surface; and conductive layers that are respectively formed on the first-conductivity-type semiconductor layer and the second-conductivity-type semiconductor layer, wherein the conductive layer on the first-conductivity-type semiconductor layer is made of a conductive paste such that the conductive layer on the first-conductive-type semiconductor layer extends along a line of the plural island-shaped sections to connect adjacent two of the plural island-shaped sections to each other.

The semiconductor substrate may be made of a semiconductor of the first conductivity type, and the second-conductivity-type semiconductor layer may have a width that is larger than the width of the first-conductivity-type semiconductor layer.

DETAILED DESCRIPTION OF EMBODIMENTS

Figure 1:
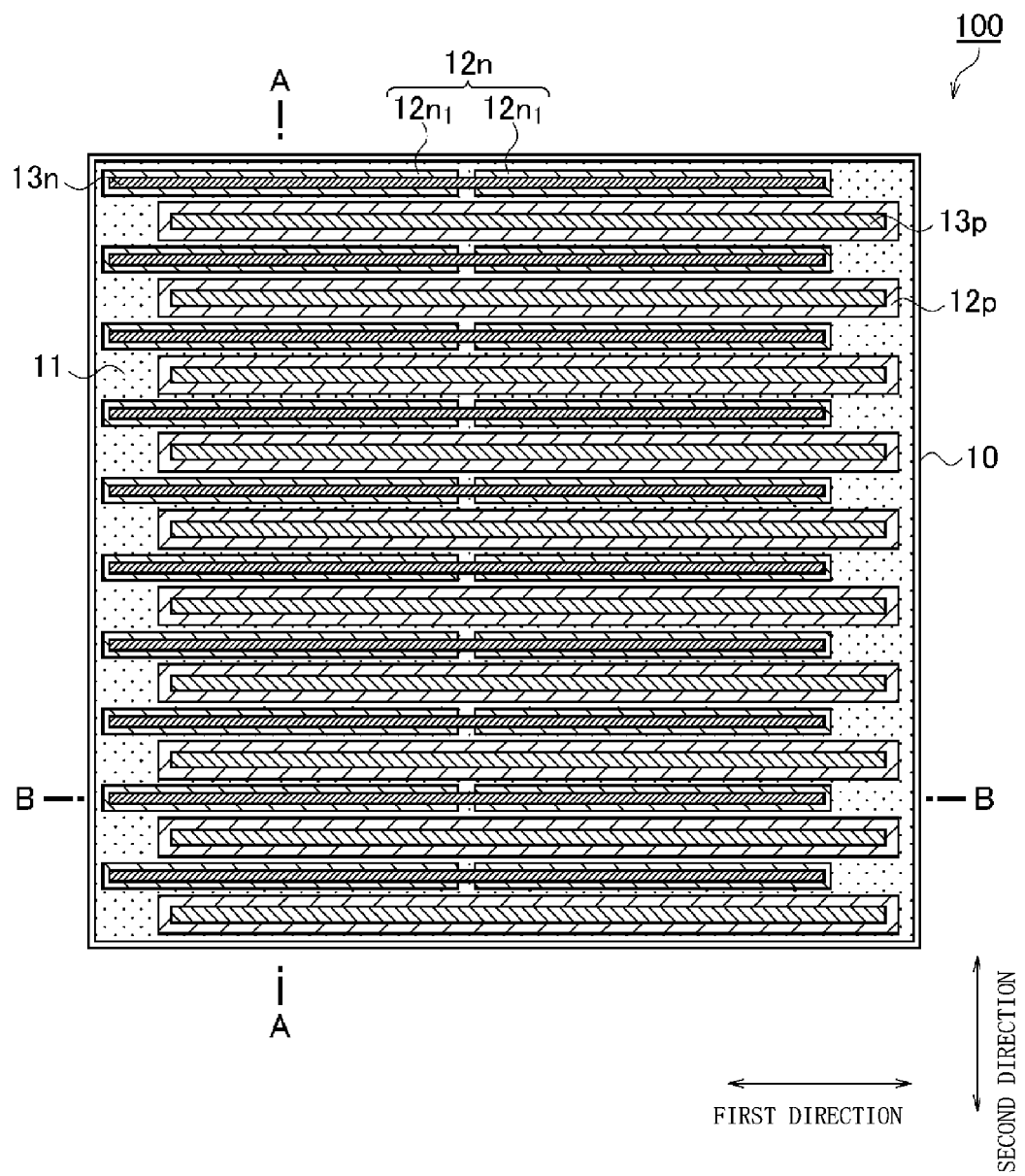
FIG. 1 is a plan view of aback surface of solar cell 100 according to an embodiment of the invention.

Descriptions are provided hereinbelow for an embodiment according to the invention based on the drawings. In the respective drawings referenced herein, the same constituents are designated by the same reference numerals and duplicate explanation concerning the same constituents is basically omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings include parts whose dimensional relationship and ratios are different from one drawing to another.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

(Configuration of Solar Cell)

Figure 2:
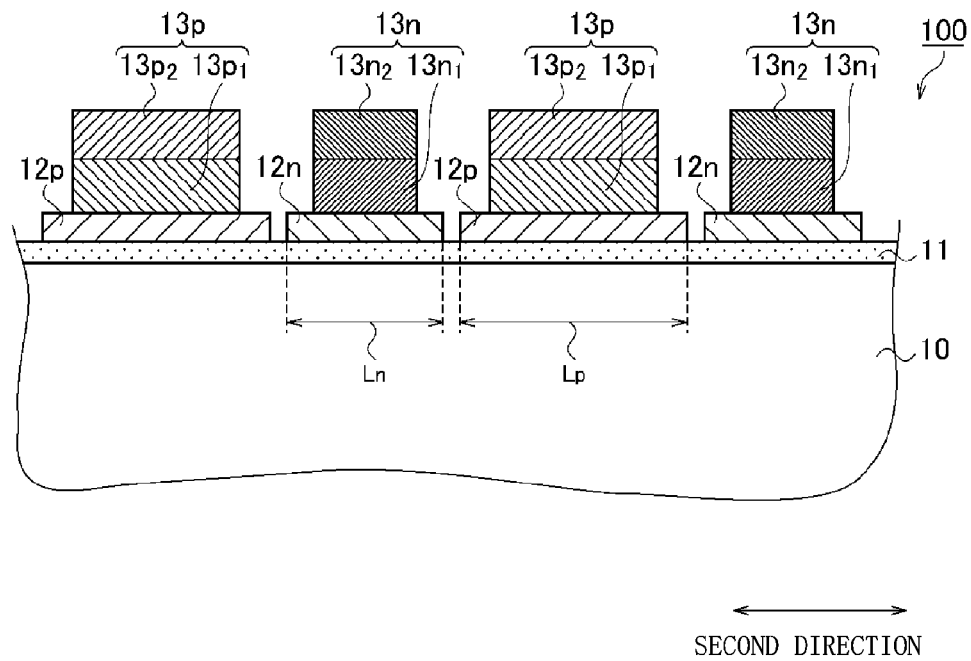
FIG. 2 is an enlarged sectional view taken along line A-A of FIG. 1.

First the configuration of a solar cell according to an embodiment of the invention is described below by referring to the drawings. FIG. 1 is a plan view of a back surface of solar cell 100. FIG. 2 is an enlarged sectional view taken along line A-A of FIG. 1.

As FIGS. 1 and 2 show, solar cell 100 includes n type semiconductor substrate 10, i type amorphous semiconductor layer 11, n type amorphous semiconductor layers 12n, p type amorphous semiconductor layers 12p, n side collecting electrodes 13n and p side collecting electrodes 13p.

N type semiconductor substrate 10 includes a light-receiving surface that receives light and a back surface provided on the opposite side of n type semiconductor substrate 10 to the light-receiving surface. N type semiconductor substrate 10 is made of a semiconductor material doped with an n type dopant. Some examples of the semiconductor material are such crystalline semiconductor materials as single-crystal Si and poly-crystal Si, and such compound semiconductor materials as GaAs and InP. That is, an ordinary semiconductor material can be used for the purpose. Upon receiving light, n type semiconductor substrate 10 generates carriers (acceptors and electrons). Since the conductivity type of n type semiconductor substrate 10 is n type, the electrons of the two different kinds of photogenerated carriers are the majority carriers whereas the acceptors are the minority carriers.

As FIG. 1 shows, i type amorphous semiconductor layer 11 is formed so as to cover substantially the entire back surface of n type semiconductor substrate 10. I type amorphous semiconductor layer 11 is an intrinsic amorphous semiconductor layer that is formed either without any dopant added to or with a small amount of dopant added to. I type amorphous semiconductor layer 11 contains hydrogen within its film, and thus has a passivation effect of preventing the recombination of photogenerated carriers in the back surface of n type semiconductor substrate 10.

Each of n type amorphous semiconductor layers $12n$ is formed on i type amorphous semiconductor layer 11 and extends in a first direction. The electrons, which are the majority carriers, are collected from n type semiconductor substrate 10 to n type amorphous semiconductor layers $12n$.

Figure 3:
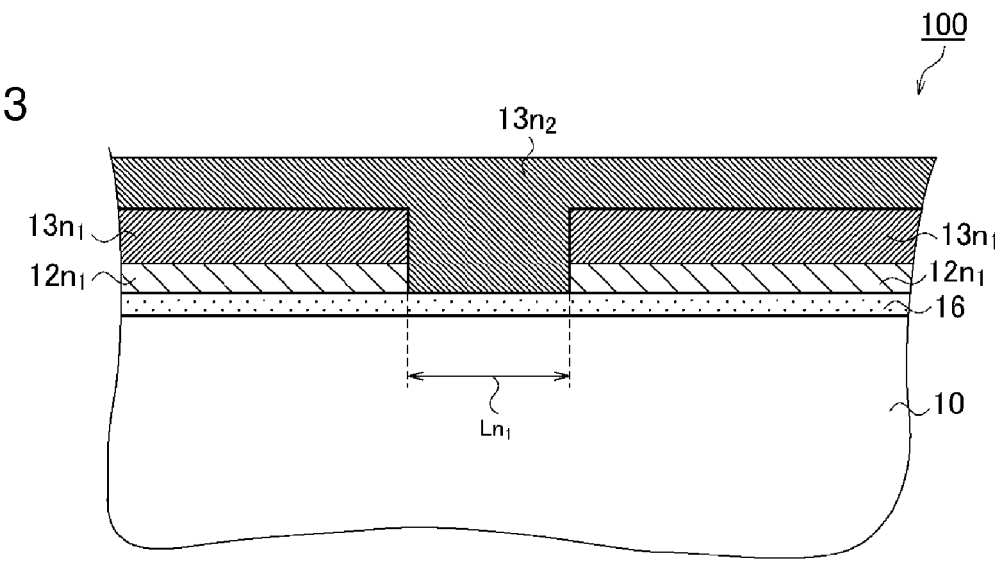
FIG. 3 is an enlarged sectional view taken along line B-B of FIG. 1.

As FIG. 1 shows, each n type amorphous semiconductor layer $12n$ is formed of two island-shaped n type amorphous semiconductor layer sections $12n_1$. Two island-shaped n type amorphous semiconductor layer sections $12n_1$ are arranged side by side in a line in the first direction. FIG. 3 is an enlarged view taken along line B-B of FIG. 1. As FIG. 3 shows, two island-shaped n type amorphous semiconductor layer sections $12n_1$ are separated away from each other by distance $Ln_1$ at the center of n type semiconductor substrate 10 in the first direction.

As FIG. 1 shows, each of p type amorphous semiconductor layers $12p$ is formed on i type amorphous semiconductor layer 11 and extends in the first direction. The acceptors, which are the minority carriers, are collected from n type semiconductor substrate 10 to p type amorphous semiconductor layers $12p$.

As FIG. 1 shows, n type amorphous semiconductor layers $12n$ and p type amorphous semiconductor layers $12p$ are arranged alternately in a second direction that is substantially orthogonal to the first direction. In addition, as FIG. 2 shows, each n type amorphous semiconductor layer $12n$ has line width Ln that is smaller than line width Lp of each p type amorphous semiconductor layer $12p$. N type amorphous semiconductor layers $12n$ collect the electrons, which are the majority carriers of n type semiconductor substrate 10. Accordingly, even if the line width of each n type amorphous semiconductor layer $12n$ is narrowed, the collection efficiency is not lowered. In addition, p type amorphous semiconductor layers $12p$ collect the acceptors, which are minority carriers of n type semiconductor substrate 10. Accordingly, if the line width of each p type amorphous semiconductor layer $12p$ is widened, the collection efficiency can be improved.

N side collecting electrodes $13n$ are collecting electrodes to collect electrons from n type semiconductor substrate 10. As FIG. 1 shows, each n side collecting electrode $13n$ is formed in the first direction. Each n side collecting electrode $13n$ is formed on and between two island-shaped n type amorphous semiconductor layer sections $12n_1$. That is, each n side collecting electrode $13n$ extends on a line of plural island-shaped n type amorphous semiconductor layer sections $12n_1$ to bridge the plural sections $12n_1$.

In addition, as FIG. 2 shows, each n side collecting electrode $13n$ is formed of n side transparent conductive layer $13n_1$ and n side conductive layer $13n_2$. N side transparent conductive layer $13n_1$ is formed on two island-shaped n type amorphous semiconductor layer sections $12n_1$. N side conductive layer $13n_2$ is formed on corresponding n side transparent conductive layer $13n_1$ and formed on i type amorphous semiconductor layer 11 between two island-shaped n type amorphous semiconductor layer sections $12n_1$, as shown in FIG. 3. N side transparent conductive layers $13n_1$ are made of an oxide of In, Zn, Sn, Ti, W, or the like. N side conductive layers $13n_2$ are made of a thermosetting-resin paste including a thermosetting resin and multiple conductive fillers. An example of such conductive fillers is silver particles.

P side collecting electrodes $13p$ are collecting electrode to collect acceptors from n type semiconductor substrate 10. As FIG. 1 shows, each p side collecting electrode $13p$ is formed on corresponding p type amorphous semiconductor layer $12p$ in the first direction.

In addition, as FIG. 2 shows, each p side collecting electrode $13p$ is formed of p side transparent conductive layer $13p_1$ and p side conductive layer $13p_2$. P side transparent conductive layer $13p_1$ is formed on p type amorphous semiconductor layer $12p$. P side conductive layer $13p_2$ is formed on p side transparent conductive layer $13p_1$. P side transparent conductive layers $13p_1$ are made of an oxide of In, Zn, Sn, Ti, W, or the like. P side conductive layers $13p_2$ are made of a thermosetting-resin paste including a thermosetting resin and multiple conductive fillers.

(Solar-Cell Manufacturing Method)

Next, a method of manufacturing solar cell 100 is described by referring to the drawings.

First, i type amorphous semiconductor layer 11 is formed substantially on the entire back surface of n type semiconductor substrate 10 by a CVD method.

Figure 4:
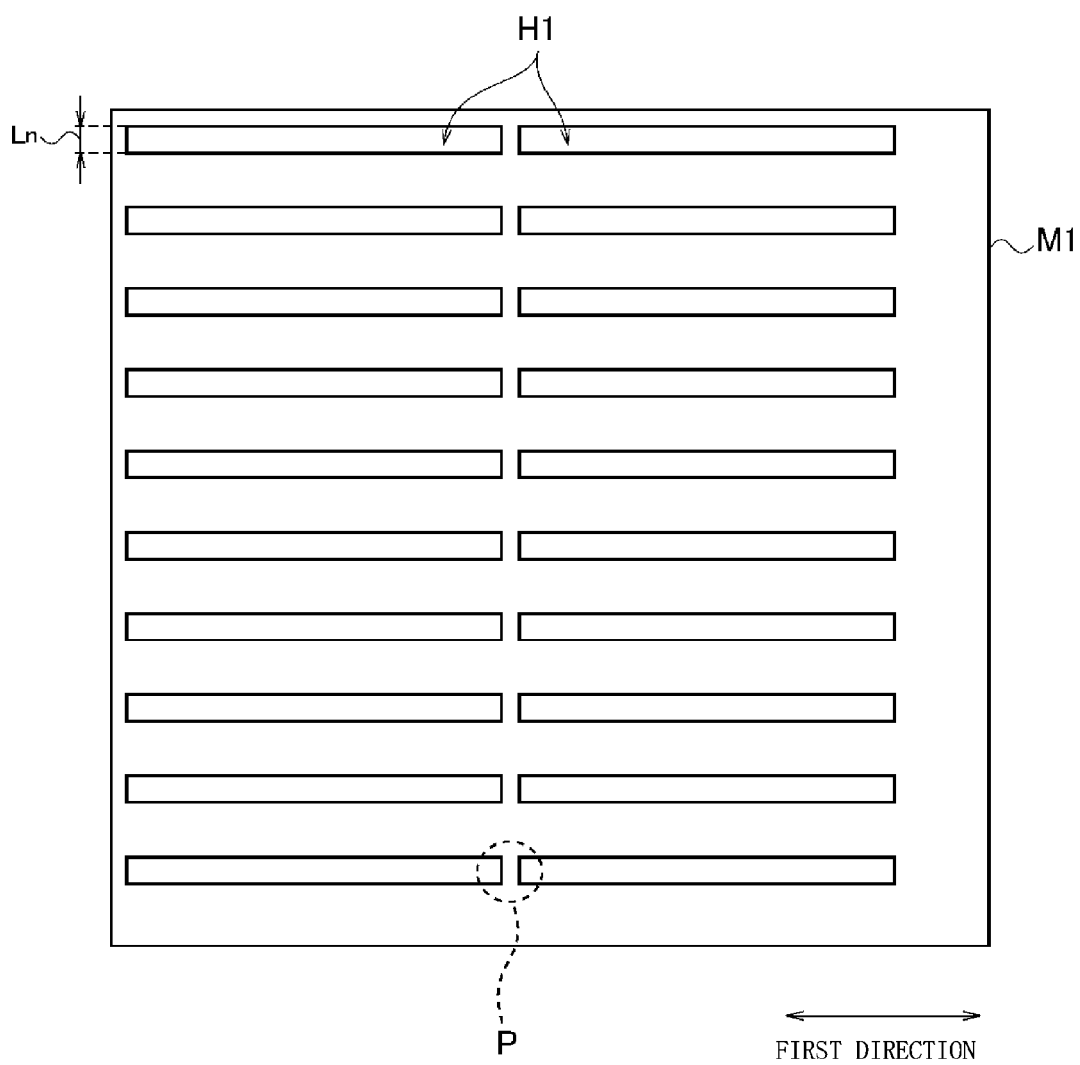
FIG. 4 is a plan view of metal mask M1 according to the embodiment.
Figure 5:
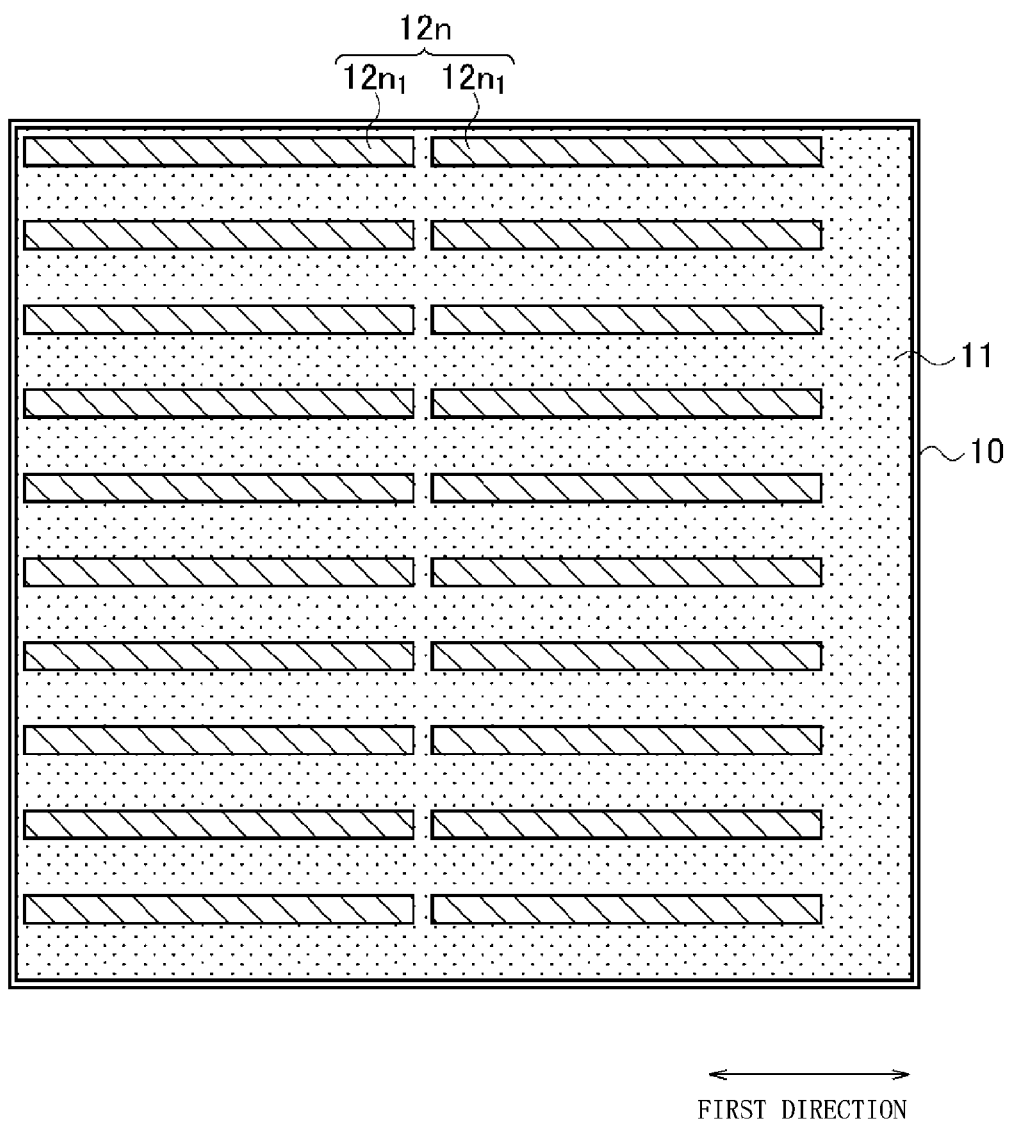
FIG. 5 is a diagram for describing a method of manufacturing solar cell 100 according to the embodiment.

Subsequently, while metal mask M1 is placed over i type amorphous semiconductor layer 11, island-shaped n type amorphous semiconductor layer sections $12n_1$ are formed by a CVD method. FIG. 4 is a plan view of metal mask M1. As FIG. 4 shows, metal mask M1 includes multiple slits H1 corresponding to the forming pattern of multiple island-shaped n type amorphous semiconductor layer sections $12n_1$. That is, metal mask M1 has bridge portions P each of which is formed between two corresponding slits H1 arranged side by side in the first direction. Bridge portions P have a function of reinforcing the overall strength of metal mask M1. Each of slits H1 has width (line width) Ln (see FIG. 2). With this metal mask M1, as FIG. 5 shows, n type amorphous semiconductor layers $12n$, each formed of two island-shaped n type amorphous semiconductor layer section $12n_1$ that are arranged side by side in the first direction, are formed.

Figure 6:
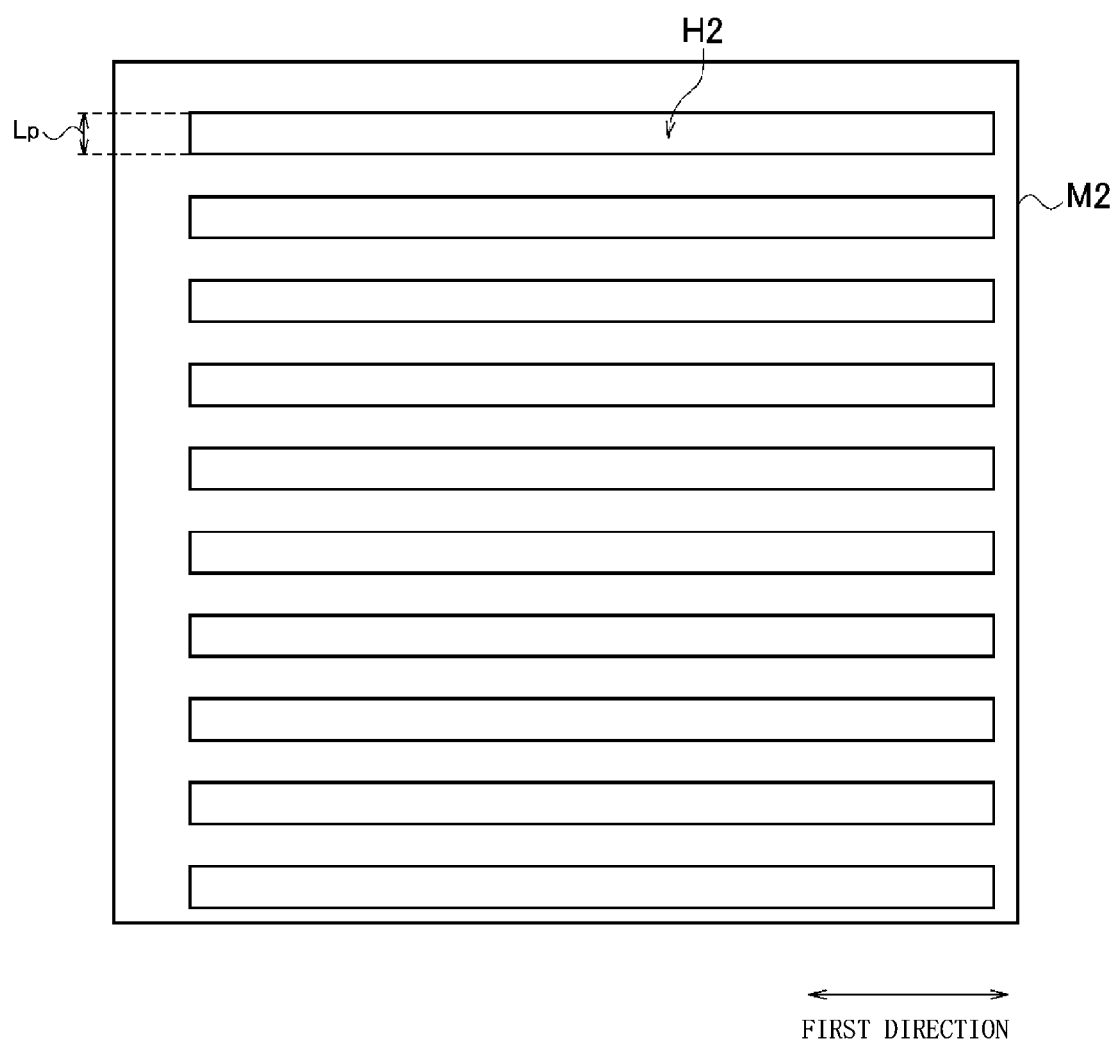
FIG. 6 is a plan view of metal mask M2 according to the embodiment.
Figure 7:
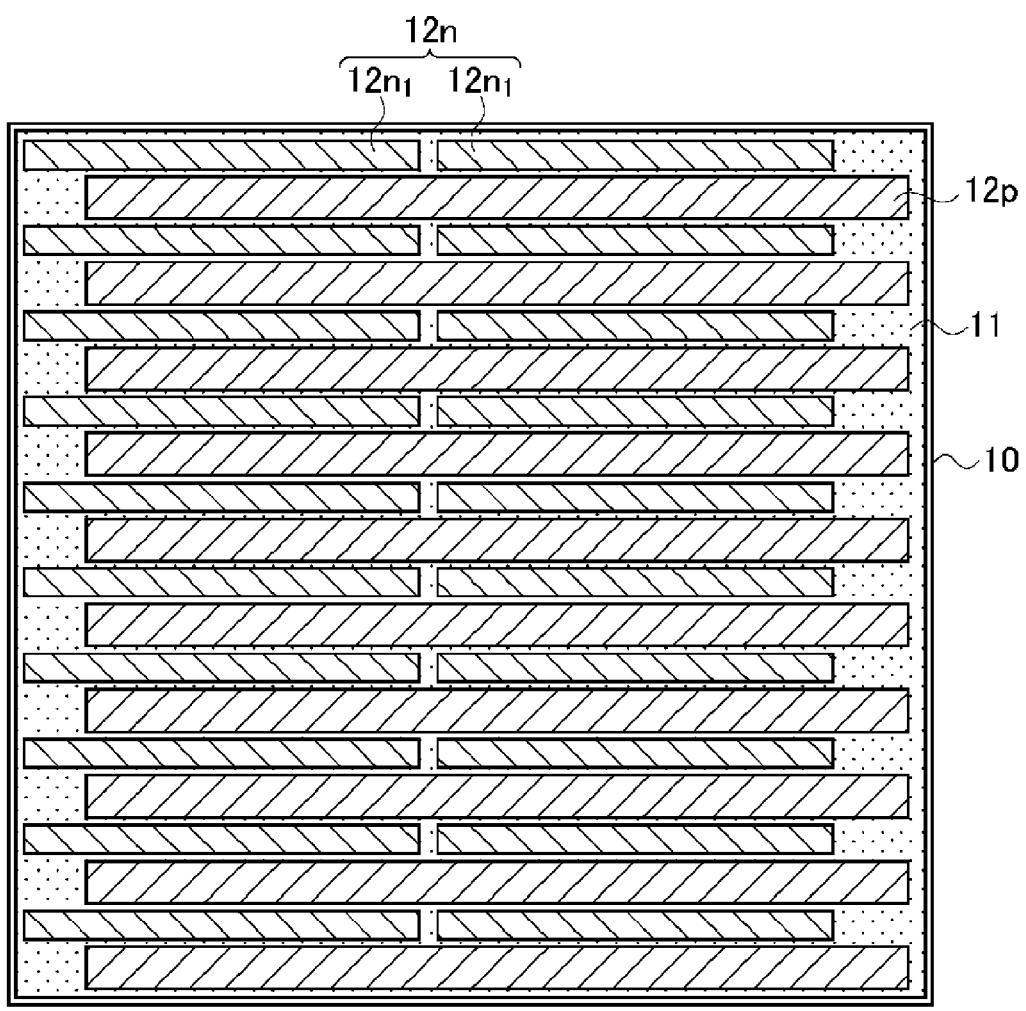
FIG. 7 is a diagram for describing the method of manufacturing solar cell 100 according to the embodiment.

Next, while metal mask M2 is placed over i type amorphous semiconductor layer 11, p type amorphous semiconductor layers $12p$ are formed by a CVD method. FIG. 6 is a plan view of metal mask M2. As FIG. 6 shows, metal mask M2 is formed with multiple slits H2 corresponding to the forming pattern of multiple p type amorphous semiconductor layers $12p$. Each of multiple slits H2 has width (line width) Lp (see FIG. 2). As FIG. 7 shows, p type amorphous semiconductor layers $12p$ are formed in the first direction using metal mask M2.

Figure 8:
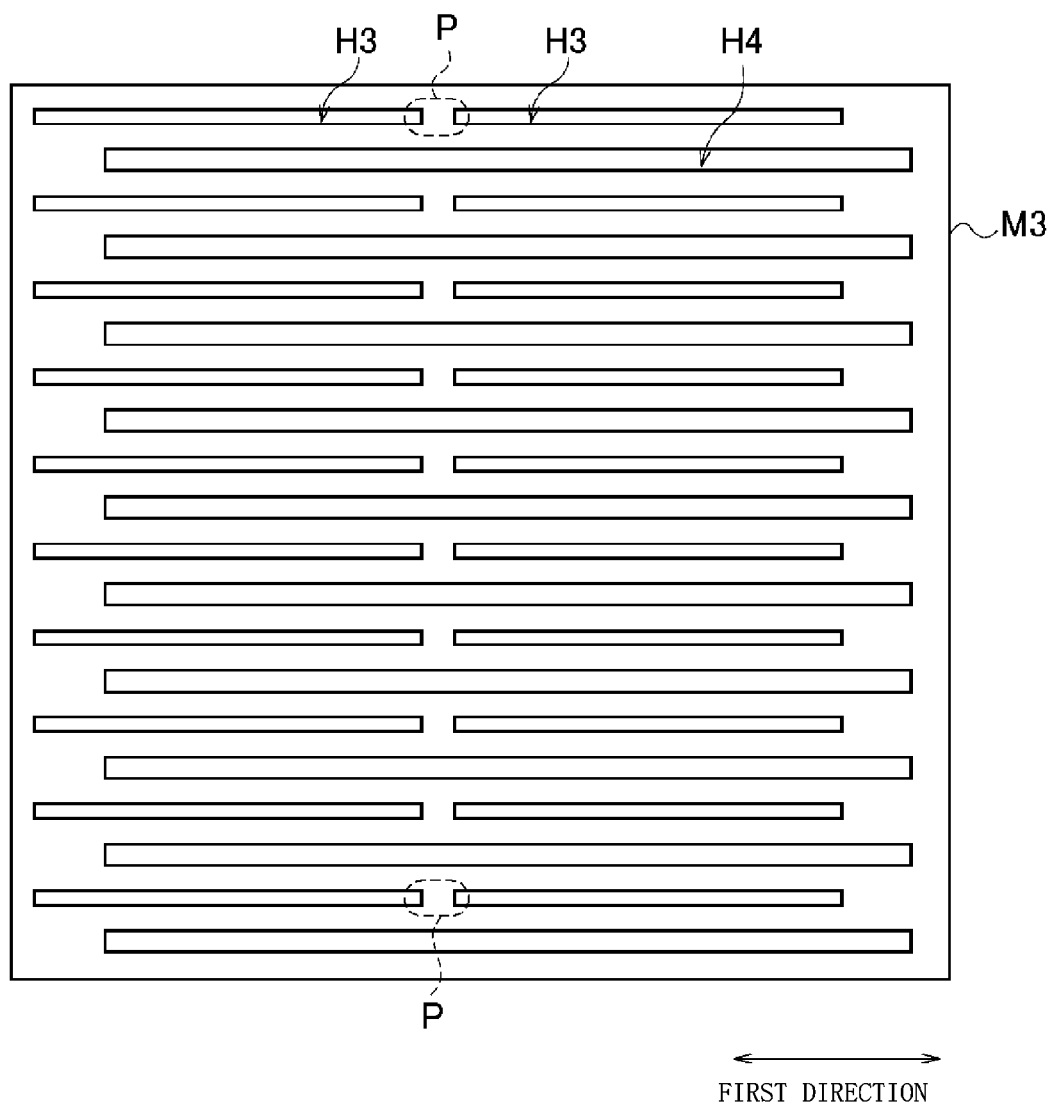
FIG. 8 is a plan view of metal mask M3 according to the embodiment.

Subsequently, while metal mask M3 is placed over i type amorphous semiconductor layer 11, n side transparent conductive layers $13n_1$ and p side transparent conductive layers $13p_1$ are formed by a sputtering method. FIG. 8 is a plan view of metal mask M3. As FIG. 8 shows, metal mask M3 is formed with multiple slits H3 corresponding to the forming pattern of multiple island-shaped n type amorphous semiconductor layer sections $12n_1$ and multiple slits H4 corresponding to the forming pattern of multiple p type amorphous semiconductor layers $12p$. To prevent each n side transparent conductive layer $13n_1$ from running out of the top of corresponding island-shaped n type amorphous semiconductor layer section $12n_1$, the dimensions of each slit H3 are preferably smaller than the dimensions of each slit H1. In addition, to prevent each p side transparent conductive layer $13p_1$ from running out of the top of corresponding p type amorphous semiconductor layer $12p$, the dimensions of each slit H4 are preferably smaller than the dimensions of each slit H2.

Figure 9:
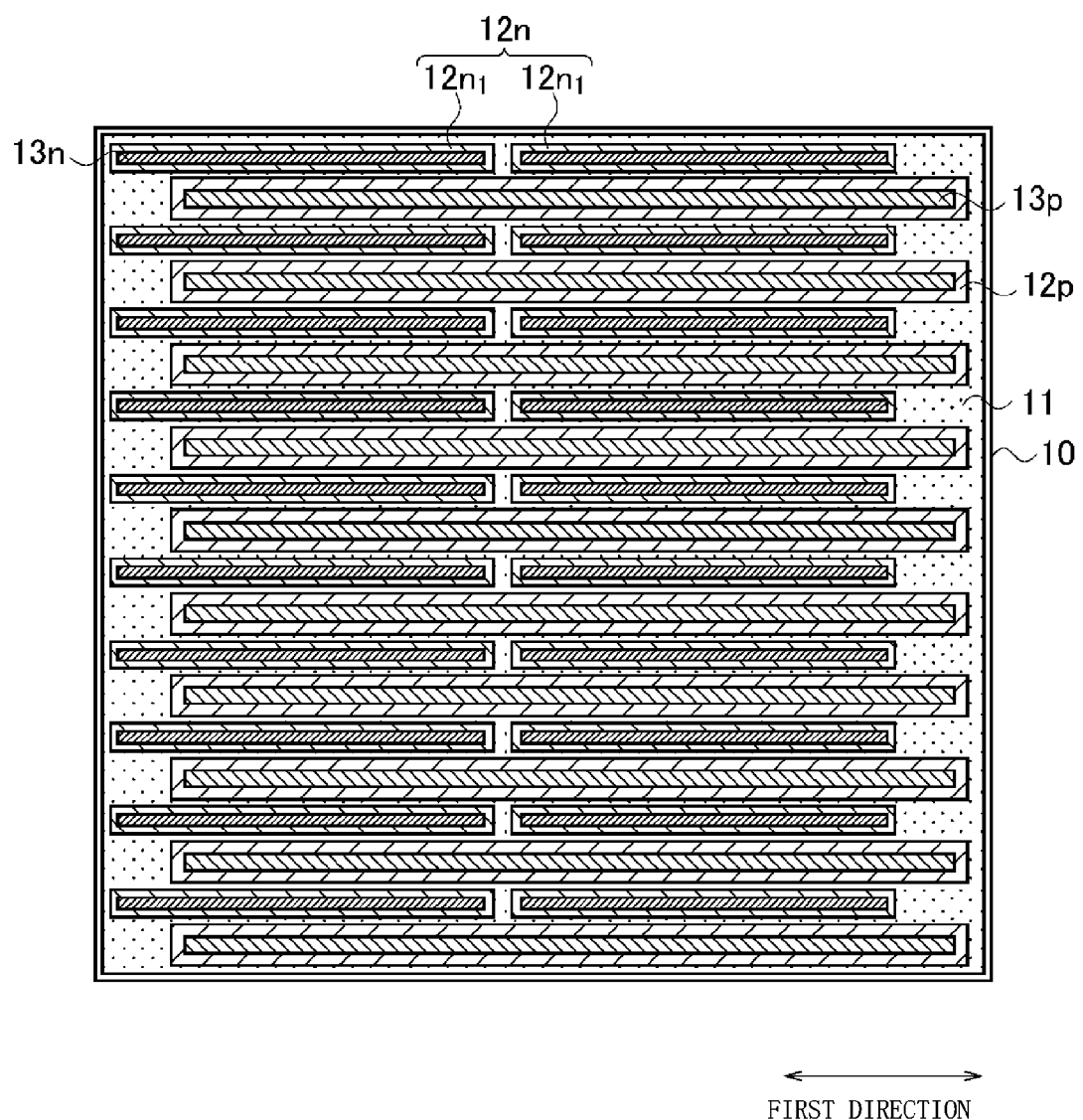
FIG. 9 is a diagram for describing the method of manufacturing solar cell 100 according to the embodiment.

As FIG. 8 shows, metal mask M3 includes bridge portions P each of which is formed between two corresponding slits H3 arranged side by side in the first direction. Bridge portions P have a function of reinforcing the overall strength of metal mask M3. As FIG. 9 shows, n side transparent conductive layers $13n_1$ and p side transparent conductive layers $13p_1$ are formed in the first direction using metal mask M3.

Subsequently, a thermosetting-resin paste is placed both on n side transparent conductive layers $13n_1$ and on p side transparent conductive layers $13p_1$ and also is placed at every interstice between two n side transparent conductive layers $13n_1$ arranged side by side in the first direction (see FIG. 3), by a printing method such as a screen printing method. With this operation, n side conductive layers $13n_2$ and p side conductive layers $13p_2$ are formed. Accordingly, two island-shaped n type amorphous semiconductor layer sections $12n_1$ are electrically connected to each other via their respective two n side transparent conductive layer $13n_1$ by n side conductive layer $13n_2$ (see FIGS. 1 and 3).

Subsequently, the thermosetting-resin paste is heated at a temperature of 300° C. or lower. This operation evaporates the organic solvent contained in the thermosetting-resin paste and hardens the thermosetting-resin paste. In this operation, the thermosetting-resin paste is heated at a temperature of 300° C. or lower, and thus the conductive fillers are not alloyed. Accordingly, the thermosetting-resin paste and i type amorphous semiconductor layer 11 are electrically isolated from each other. Consequently, no leakage current occurs between n side conductive layers $13n_2$ and n type semiconductor substrate 10 as well as between p side conductive layers $13p_2$ and n type semiconductor substrate 10.

EFFECTS

According to the method of manufacturing solar cell 100 of the embodiment, metal mask M1 is formed with: pairs of slits H1 corresponding to the forming pattern of pairs of island-shaped n type amorphous semiconductor layer sections $12n_1$; and bridge portions P each of which is formed between corresponding pair of slits H1. This configuration allows a distance between slits H1 to be narrowed, while maintaining the strength of metal mask M1. That is, more densely, microscopically formed n type amorphous semiconductor layers $12n$ can be provided, while preventing the damages on the substrate and the misalignment of the pattern. Incidentally, according to the method of manufacturing solar cell 100 of the embodiment, n side conductive layers $13n_2$ are formed by a printing method. Accordingly, n side conductive layers $13n_2$ each having a smaller line width can be formed on and between corresponding pair of island-shaped n type amorphous semiconductor layer sections $12n_1$. This configuration can provide a solar cell of high conversion efficiency.

In addition, metal mask M3 is formed with: pairs of slits H3 corresponding to the forming pattern of pairs of island-shaped n type amorphous semiconductor layer sections $12n_1$; and bridge portions P each of which is formed between corresponding pair of slits H3. Accordingly, this configuration allows the widths (line widths) of each of slits H3 and slit H4 to be narrowed and the distance between each slit H3 and adjacent slit H4 to be narrowed, while maintaining the strength of metal mask M3. As a result, while preventing the damages on the substrate and the misalignment of the pattern, more densely, microscopically formed n side transparent conductive layers $13n_1$ and p side transparent conductive layers $13p_1$ can be provided.

In addition, n side conductive layers $13n_2$ are made of a thermosetting-resin paste that can be hardened at a relatively low temperature. Accordingly, even through each n side conductive layer $13n_2$ is in direct contact with i type amorphous semiconductor layer 11 at the interstice between the pair of n side transparent conductive layer sections $13n_1$ that are formed correspondingly to the pair of slits H3, the resistivity of i type amorphous semiconductor layer 11 is not lowered, and thus, no leakage current occurs between n side conductive layers $13n_2$ and n type semiconductor substrate 10.

In addition, line width Lp of each p type amorphous semiconductor layer 12p is larger than line width Ln of each n type amorphous semiconductor layer 12n. Accordingly, the acceptors, which are the minority carriers of all the carriers generated by n type semiconductor substrate 10, can be efficiently collected to p type amorphous semiconductor layers 12p. This can provide the carrier-collection efficiency of entire solar cell 100.

OTHER EMBODIMENTS

The invention has been described thus far on the basis of the above-described embodiment, but the description and the drawings that form parts of this disclosure should not be understood as limitations to the invention. Those skilled in the art may conceive of various alternative embodiments, examples, and implementation techniques on the basis of this disclosure.

For example, in the above-described embodiment, n type amorphous semiconductor layers 12n and p type amorphous semiconductor layers 12p are formed on the back surface of n type semiconductor substrate 10 by the CVD method. Instead, n type semiconductor layers and p type semiconductor layers may be formed on the back surface of n type semiconductor substrate 10 by a thermal diffusion method.

In addition, though not specifically mentioned in the above-described embodiment, on one side, in the first direction, of the back surface of solar cell 100, the n type amorphous semiconductor layers and the n side collecting electrodes may be formed sequentially in the second direction, and, on the other side, in the first direction, of the back surface of solar cell 100, the p type amorphous semiconductor layers and the p side collecting electrodes may be formed sequentially in the second direction. Accordingly, the carriers can be collected from the entire back surface of solar cell 100. Consequently, the carrier-collection efficiency can be further improved.

In addition, in the above-described embodiment, each n type amorphous semiconductor layer 12n is formed of two island-shaped n type amorphous semiconductor layer sections $12n_1$, but this is not the only possible example. For example, each n type amorphous semiconductor layer 12n may be formed of three or more island-shaped n type amorphous semiconductor layer sections $12n_1$. Note that as each n type amorphous semiconductor layer 12n is formed of more island-shaped n type amorphous semiconductor layer sections $12n_1$, the metal mask M3 has more bridge portions P. Accordingly, the strength of metal mask M3 can be enhanced furthermore.

In addition, in the above-described embodiment, each n type amorphous semiconductor layer 12n is formed of plural island-shaped n type amorphous semiconductor layer sections $12n_1$. Alternatively, each p type amorphous semiconductor layer 12p may be formed of plural island-shaped p type amorphous semiconductor layer sections. In this case, each slit H2 extending along the first direction is divided by at least one bridge portion into plural slits H2 in metal mask M1, and each slit H4 extending along the first direction is divided by at least one bridge portion into plural slits H4 in metal mask M3. In such a structure that metal mask M1 includes the divided slits H2, a distance between slits H2 can be narrowed, while maintaining the strength of metal mask M1. Furthermore, in such a structure that metal mask M3 includes the divided slits H4, a distance between slits H4, a distance between slits H4 and a distance between slits H3 and H4 can be narrowed, while maintaining the strength of metal mask M3. With this configuration, more densely, microscopically formed semiconductor layers can be provided, while preventing the damages on the substrate and the misalignment of the pattern. A solar cell having high conversion efficiency can be thus manufactured. Note that even through each p side conductive layer $13p_2$ is in direct contact with i type amorphous semiconductor layer 11, the resistivity of i type amorphous semiconductor layer 11 is not lowered, and thus, no leakage current occurs between p side conductive layers $13p_2$ and i type amorphous semiconductor layer 11.

In addition, in the above-described embodiment, n side conductive layers $13n_2$ and p side conductive layer $13p_2$ are formed by placing a thermosetting-resin paste by the printing method, but this is not the only possible example. For instance, n side conductive layers $13n_2$ and p side conductive layer $13p_2$ only have to be formed by a method that does not use any metal mask. N side conductive layers $13n_2$ and p side conductive layer $13p_2$ may be formed by other kinds of conductive paste than the thermosetting-resin paste.

In addition, in the above-described embodiment, i type amorphous semiconductor layer 11 is formed substantially on the entire back surface of solar cell 100, but i type amorphous semiconductor layer 11 does not have to be formed. Even in this case, the thermosetting-resin paste is not alloyed, so that no leakage current occurs between n side conductive layers $13n_2$ and n type semiconductor substrate 10.

Meanwhile, in the above-described embodiment, the term "amorphous" also refers to the material contains microscopic crystal particles, and the term "semiconductor" includes common fact that the semiconductors such as silicon, silicon carbide, or the like.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:
1. A method of manufacturing a solar cell, comprising:
   a step A of forming a semiconductor layer of a first conductivity type extending along a predetermined direction on a back surface of a semiconductor substrate of the first conductivity type that includes a light-receiving surface and with the back surface located on an opposite side to the light-receiving surface, the first-conductivity-type semiconductor layer being divided into plural island-shaped sections side by side in the predetermined direction, the first-conductivity-type semiconductor layer being formed using a metal mask including: plural slits corresponding to the plural island-shaped sections; and a divide portion between adjacent two of the slits;
   a step B of forming a semiconductor layer of a second conductivity type in the predetermined direction on the back surface so as to have a width that is larger than a width of the first-conductivity-type semiconductor layer; and a step C of forming a conductive layer respectively on the first-conductivity-type semiconductor layer and the second-conductivity-type semiconductor layer by using a conductive paste, the conductive layer to be formed on the first-conductivity-type semiconductor layer being formed by a printing method such that a conductive layer to be formed on the first-conductivity-type semiconductor layer extends on a line of the plural island-shaped sections to bridge directly adjacent two of the plural island-shaped sections.

2. The method of manufacturing a solar cell according to claim 1, wherein forming the semiconductor layer of the first conductivity type is done by chemical vapor deposition (CVD).

3. The method of manufacturing a solar cell according to claim 2, wherein forming the semiconductor layer of the second conductivity type is done by CVD.

* * * * *